United States Patent
Li et al.

(10) Patent No.: US 10,200,070 B2
(45) Date of Patent: Feb. 5, 2019

(54) SPUR CANCELLATION SYSTEM FOR MODEMS

(71) Applicant: Cypress Semiconductor Corporation, San Jose, CA (US)

(72) Inventors: Yan Li, Morganville, NJ (US); Wendy Yu, San Jose, CA (US); Kamesh Medapalli, San Jose, CA (US); Hongwei Kong, Basking Ridge, NJ (US); Patrick Cruise, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/631,922

(22) Filed: Jun. 23, 2017

(65) Prior Publication Data

US 2018/0205402 A1    Jul. 19, 2018

Related U.S. Application Data

(60) Provisional application No. 62/446,102, filed on Jan. 13, 2017.

(51) Int. Cl.
| | |
|---|---|
| *H04B 1/10* | (2006.01) |
| *H04B 1/16* | (2006.01) |
| *H04L 27/14* | (2006.01) |

(52) U.S. Cl.
CPC ............. *H04B 1/10* (2013.01); *H04B 1/16* (2013.01); *H04L 27/14* (2013.01)

(58) Field of Classification Search
CPC .... H04B 1/10; H04B 1/16; H04B 1/30; H04L 27/14; H04L 27/22; H04L 27/38; H04L 2027/0016; H04L 2027/0065
See application file for complete search history.

(56) References Cited

U.S. PATENT DOCUMENTS

| | | | |
|---|---|---|---|
| 8,134,411 B2 | 3/2012 | Shi et al. | |
| 8,184,754 B1 | 5/2012 | Choi et al. | |
| 8,598,929 B1* | 12/2013 | Wicpalek | H03L 7/093 327/147 |
| 9,160,465 B2 | 10/2015 | Arslan | |
| 9,369,217 B1 | 6/2016 | Jakoby et al. | |
| 9,473,155 B2 | 10/2016 | Staszewski et al. | |
| 2002/0186799 A1* | 12/2002 | Sayeed | H03G 3/3078 375/345 |
| 2003/0235262 A1* | 12/2003 | Staszewski | H03L 7/087 375/376 |

(Continued)

OTHER PUBLICATIONS

Wu, Lianbo, "An Ultra-Low-Power ADPLL for BLE Applications," Master Thesis at Delft University of Technology, 2014; 144 pages.

(Continued)

*Primary Examiner* — Aristocratis Fotakis

(57) ABSTRACT

A modem includes a modulator and a demodulator. The demodulator includes a direct current removing (DCR) circuit to transition between an acquisition mode, where the DCR circuit operates with a first loop gain; and a tracking mode, where the DCR circuit operates with a second loop gain. The second loop gain is smaller than the first loop gain, and the timing of the transition between the acquisition mode and tracking mode is programmable.

20 Claims, 5 Drawing Sheets

(56) References Cited

U.S. PATENT DOCUMENTS

| | | | | |
|---|---|---|---|---|
| 2004/0137860 | A1* | 7/2004 | Oh | H04W 52/12 |
| | | | | 455/127.1 |
| 2005/0152463 | A1* | 7/2005 | DeChamps | H04L 27/2647 |
| | | | | 375/260 |
| 2006/0076993 | A1* | 4/2006 | Teo | H03K 5/13 |
| | | | | 327/165 |
| 2006/0093079 | A1* | 5/2006 | Kim | H04L 25/062 |
| | | | | 375/344 |
| 2006/0203950 | A1* | 9/2006 | Chung | H03J 1/0083 |
| | | | | 375/376 |
| 2006/0215778 | A1* | 9/2006 | Murthy | G06F 1/0353 |
| | | | | 375/260 |
| 2006/0256463 | A1* | 11/2006 | Ozdemir | G11B 5/09 |
| | | | | 360/46 |
| 2008/0266001 | A1* | 10/2008 | Griffin | H03L 7/091 |
| | | | | 331/25 |
| 2015/0049651 | A1 | 2/2015 | Hariharan et al. | |
| 2016/0020794 | A1 | 1/2016 | Singh et al. | |

OTHER PUBLICATIONS

International Search Report for International Application No. PCT/US17/61937 dated Dec. 26, 2017; 3 pages.
Written Opinion of the International Searching Authority for International Application No. PCT/US17/61937 dated Dec. 26, 2017; 6 pages.

* cited by examiner

SPUR CANCELLATION SYSTEM FOR MODEMS

CROSS-REFERENCE TO RELATED APPLICATIONS

The present application claims the benefit under 35 U.S.C. § 119(e) of U.S. Provisional Application Ser. No. 62/446,102, filed Jan. 13, 2017. Said U.S. Provisional Application Ser. No. 62/446,102 is hereby incorporated by reference in its entirety.

TECHNICAL FIELD

The present disclosure generally relates to the field of communication devices, and particularly to spur cancellation techniques utilized in communication devices.

BACKGROUND

A modem (modulator-demodulator) is a network device that modulates and demodulates signals to facilitate transmission of information. A modem may employ a certain type of frequency modulation scheme to implement modulation and demodulation. For instance, modems such as Bluetooth modems, ZigBee modems, Bluetooth Low Energy (BLE) modems and the like may employ a particular type of frequency modulation scheme called frequency-shift keying (FSK) modulation. FSK modulation may be configured to facilitate transmission of digital information through discrete frequency changes.

Frequencies utilized by FSK modems may be controlled using oscillators, which may cause interference signals (referred to as spurs) to appear. Spurs may degrade the performance and may cause communication failures.

SUMMARY

Embodiments of the present disclosure are directed toward a modem, comprising a modulator and a demodulator. The demodulator includes a direct current removing (DCR) circuit to transition between an acquisition mode, where the DCR circuit operates with a first loop gain; and a tracking mode, where the DCR circuit operates with a second loop gain. The second loop gain may be smaller than the first loop gain, and the timing of the transition between the acquisition mode and tracking mode may be programmable.

It is to be understood that both the foregoing general description and the following detailed description are for example and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
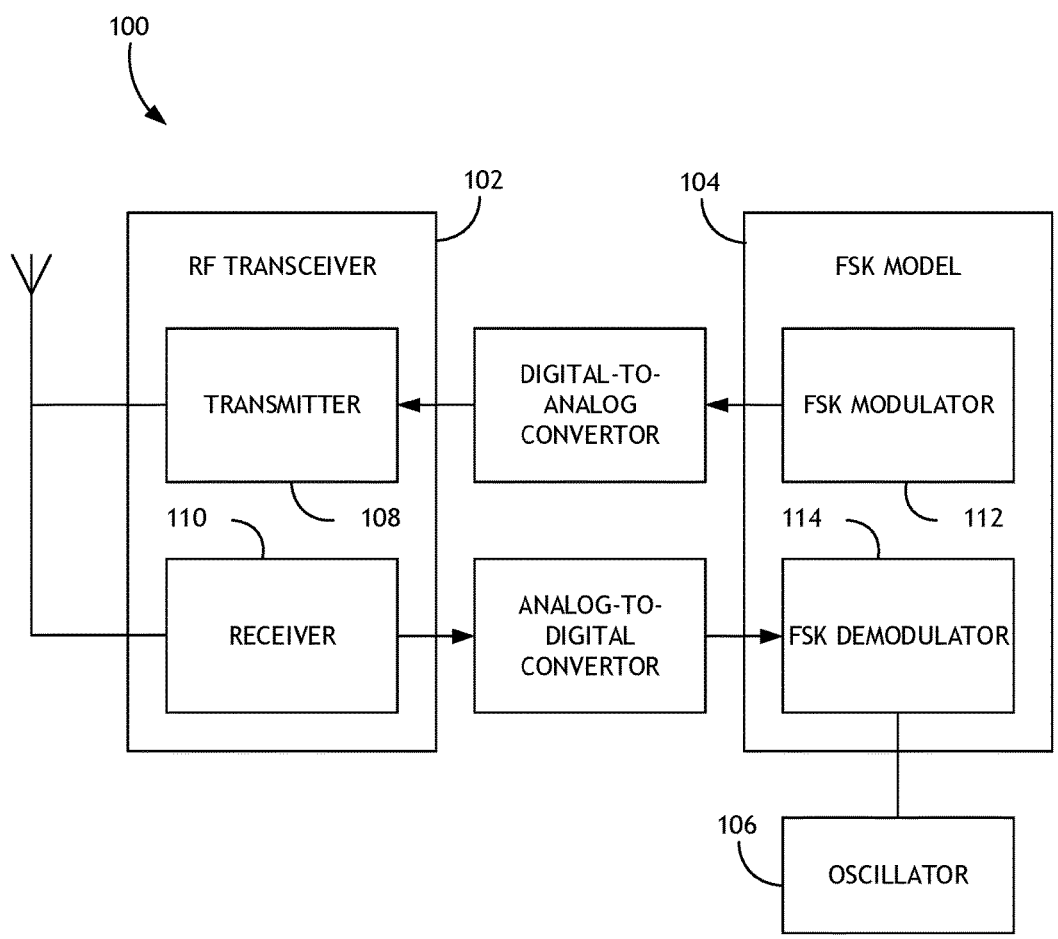
FIG. 1 is a block diagram depicting a radio equipped with a demodulator configured in accordance with an embodiment of the present disclosure.

Referring generally to FIG. 1, a simplified block diagram depicting a radio 100 is shown. It is noted that since radio devices are well understood by those skilled in the art, detailed descriptions of each component of the radio 100 depicted in FIG. 1 are not repeated in the present disclosure. Generally, the radio 100 may include a radio frequency (RF) transceiver 102, a modem 104, and an oscillator 106. The RF transceiver 102 may include a transmitter 108 and a receiver 110. The transmitter 108 may be configured to transmit signals provided by a modulator 112. The receiver 110, on the other hand, may be configured to receive signals and provide the received signals to a demodulator 114 for processing. It is to be understood that while the modulator 112 and the demodulator 114 are shown to be implementing FSK modulation, implementation of FSK modulation is merely shown as an illustration and is not meant to be limiting. It is contemplated that the modulator 112 and the demodulator 114 may implement various other types of time-based modulations without departing from the spirit and scope of the present disclosure.

The oscillator 106 may be configured to use a digital clock to generate oscillating signals. The oscillator 106 may cause interference signals (spurs). For instance, a 16 MHz Analog-to-Digital Converter (ADC) clock may generate harmonics spurs at N×16 MHz, including 2480 MHz, which may coincide with the center frequency of one of the channel used by the radio 100 if the radio 100 is a BLE radio. Spurs as such have a significant impact on the performance of the radio 100 and should therefore be cancelled or reduced.

Figure 2:
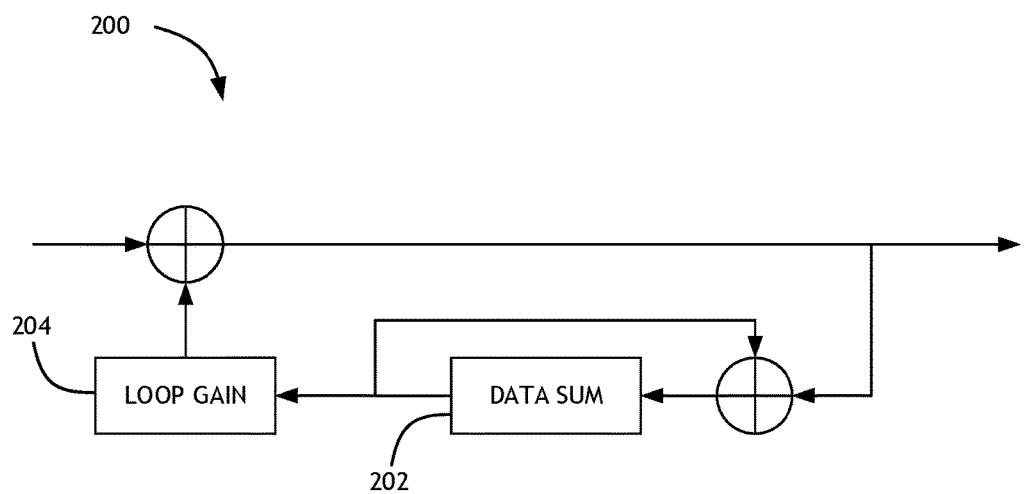
FIG. 2 is a simplified block diagram depicting a direct current removing (DCR) circuit utilized as a part of a digital front end of a demodulator.

FIG. 2 is a simplified block diagram depicting a direct current removing (DCR) circuit 200 that may be utilized as a part of the digital front end of the demodulator 114 to help reduce spur. The DCR circuit 200 may include an accumulator 202 and a loop gain block 204. In some embodiments, the values of the loop gain may be limited to the powers of 2 and implemented as bit shifts via a system of registers that transfer bits to arrive at a value that is a higher order of magnitude. It is contemplated that since the accumulator 202 and the loop gain block 204 are configured to perform linear operations, the order of the two blocks 202 and 204 may be interchangeable without departing from the spirit and scope of the present disclosure.

It is also contemplated that while the DCR circuit 200 may be able to track and reduce spurs, its effectiveness may be limited if the radio 100 employs power management solutions. For instance, to help reduce power consumptions, the receiving path (e.g., the receiver 110 and the modulator 112) of the radio 100 may be turned off after receiving a data packet. The receiving path may be turned on again to warm up before the arrival of the next data packet. The DCR circuit 200 may continuously track the spur and the loop gain block 204 may choose a gain value to minimize the spur estimate fluctuation in order to optimize the access code and data demodulation performance. However, the loop gain block 204 may require a relatively long settling time for the DCR circuit 200 to converge. Longer settling/warm-up time implies that the radio 100 must wake up much earlier than the arrival of data packets, effectively increasing its power consumption.

DCR circuits configured in accordance with some embodiments of the present disclosure may be configured to support multiple modes of spur cancellation to improve their effectiveness. In some embodiments, for example, a multi-mode DCR circuit 200 may be setup in the same manner as the DCR circuit 200 shown in FIG. 2. However, instead of using a fixed loop gain block 204, the loop gain block 204 in a multi-mode DCR circuit 200 may be dynamically changed and controlled. Since timing is critical, it is contemplated that a hardware finite state machine (FSM) may be implemented to control the dynamic switch of the loop gains. In some embodiments, the FSM may be configured to transition among an acquisition mode, a tracking mode, and a holding mode.

The acquisition mode may be entered when the receiving path of the radio 100 is turned on (or woken up). The acquisition mode may be configured with large loop gain to quickly converge, hence reducing the settling/warm-up time. The tracking mode may be entered after lapse of a programmable time (e.g., 4 us) or at the end of the acquisition mode. The tracking mode may be configured with a smaller loop gain compared to the acquisition mode.

In some embodiments, the spur estimate acquired in the acquisition mode may be used as the initial value for the tracking mode. To facilitate this process, the accumulation value maintained by the loop gain block 204 may need to be properly scaled when the loop gain block 204 switches from the acquisition mode to the tracking mode. Mathematically, the relationship between the accumulation value and the new accumulation value may be expressed as:

Accumulation Value×Loop Gain=New Accumulation Value×New Loop Gain which means that the new accumulation value can be determined as:

$$\text{New Accumulation Value} = \frac{\text{Accumulation Value} \times \text{Loop Gain}}{\text{New Loop Gain}}$$

It is noted that this scaling operation may only need to be performed once during the mode switch. Alternatively, if the order of the accumulator 202 and the loop gain block 204 is reversed (with respect to the order depicted in FIG. 2), the accumulation value does not need to be scaled when the loop gain mode switches because the final loop gain value before the mode switch includes the most recent accumulation value.

In some embodiments, the FSM may also be configured to support a third mode referred to as the holding mode. If the holding mode is enabled, entering the holding mode (e.g., upon completion of synchronization) may freeze the feedback loop of the DCR circuit for data demodulation. Freezing the feedback loop saves power by maintain a current loop gain. A timer may cause the circuit to exit the holding mode periodically to adjust the current loop gain or reenter the tracking mode. Alternatively, a threshold packet error ratio may be used to indicate that the loop gain needs to be adjusted and the circuit may be taken out of the hold mode. If the holding mode is disabled, the FSM may simply transition between the acquisition mode and the tracking mode as described above.

It is contemplated that DCR circuits configured in accordance with embodiments of the present disclosure may be implemented as a part of the digital front end of the demodulators. It is contemplated that a digital front end of a demodulator may be implemented as an application-specific integrated circuit (ASIC), a part of which may include the various components depicted in FIG. 2 that form the demodulator. It is contemplated that demodulators configured as such may be utilized in various types of time-based modems, including low-frequency clock and low-power modems.

Figure 3:
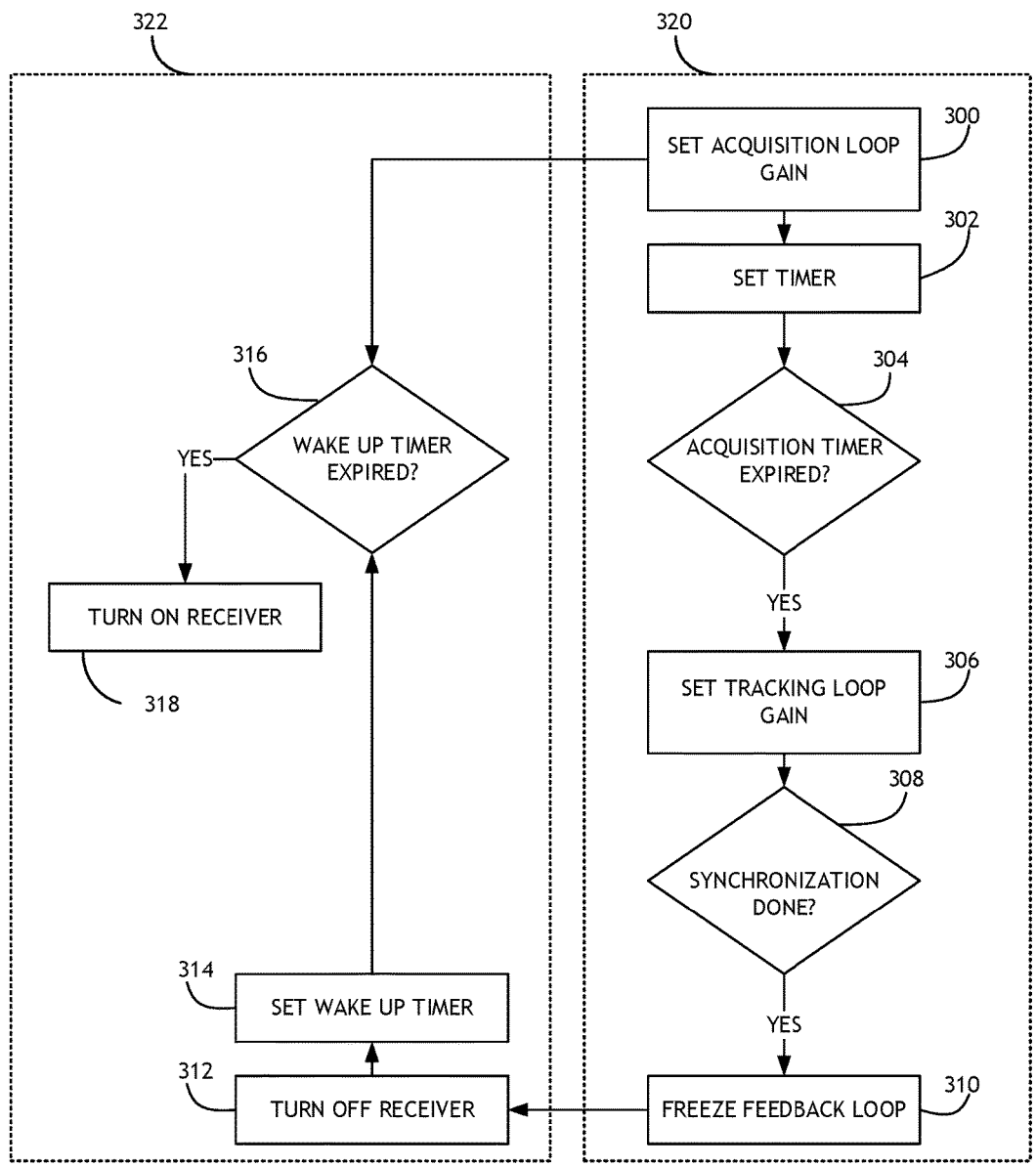
FIG. 3 is a diagram of a finite state machine for switching a DCR circuit between an acquisition mode and a tracking mode in accordance with an embodiment of the present disclosure.

FIG. 3 is a diagram of a finite state machine for switching a DCR circuit between an acquisition mode and a tracking mode. An acquisition mode is entered and a first loop gain is set 300 to quickly converge, and thereby reduce the settling/warm-up time. An acquisition mode timer is set 302 to establish a limit for the acquisition more. When the acquisition more timer expires 304 (e.g., 4 us), a tracking mode is entered 306 with a second loop gain. The acquisition mode timer may be programmable. Alternatively, or in addition, the circuit may identify when the acquisition mode has acquired a signal. The tracking mode may be configured with a smaller loop gain compared to the acquisition mode. In some embodiments, when synchronization is complete 308, the circuit may be placed into a holding state where the feedback loop to continuously update the loop gain value is frozen 310. The receiver is then turned off 314. In some embodiments, a wake up timer is set 314. When the wake up timer expires 316, the receiver is reactivated for warm up to receive the next packet.

The state of the receiver on or off while a wake up timer is executing may be regarded as a receiver state 320. Likewise, while in an acquisition mode with an acquisition timer or updating a loop gain value while receiving, the machine may be regarded as in a DCR state. A finite state machine according to embodiments of the present disclosure may be software based of hardware based.

Figure 4:
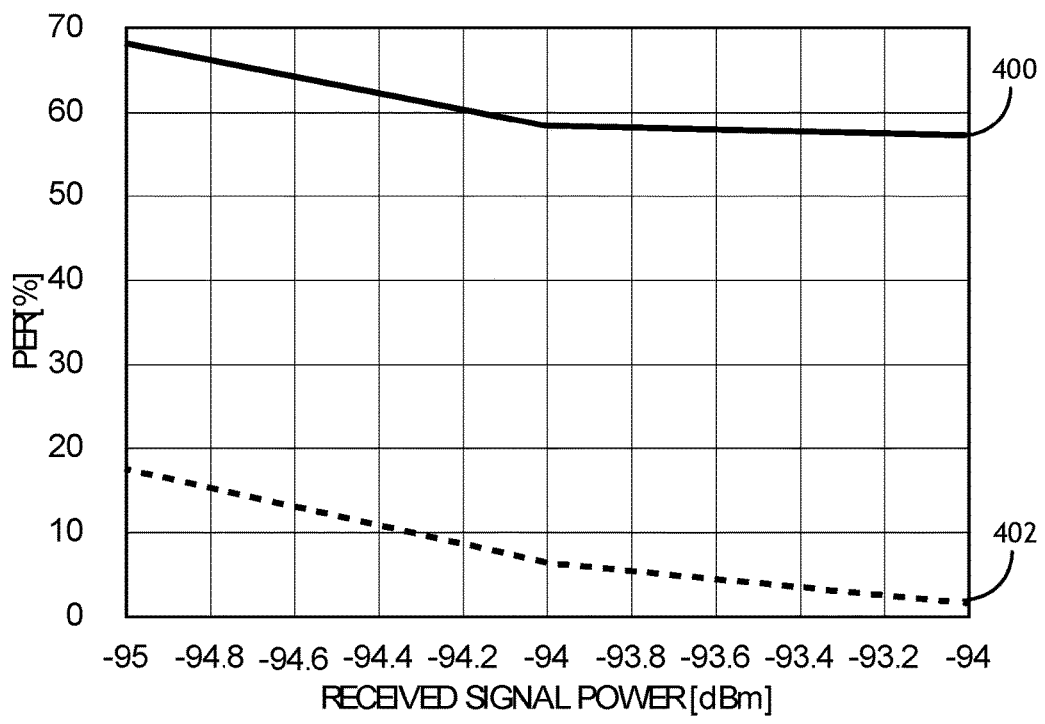
FIG. 4 is a diagram depicting experiment data illustrating the effectiveness of a DCR circuit configured in accordance with an embodiment of the present disclosure.

FIG. 4 is a diagram depicting experiment data that illustrates the effectiveness of multi-mode DCR circuits when the data payload length is set to 37 bytes and the receiver warm-up time is set to 9 us. Compared to the baseline 400 established using a conventional DCR circuit, a multi-mode DCR circuit 402 configured in accordance with the present disclosure significantly reduced convergence time and met the 30.8% packet error ratio (PER) requirement at −95 dBm sensitivity level for spur channels with sufficient margins.

Figure 5:
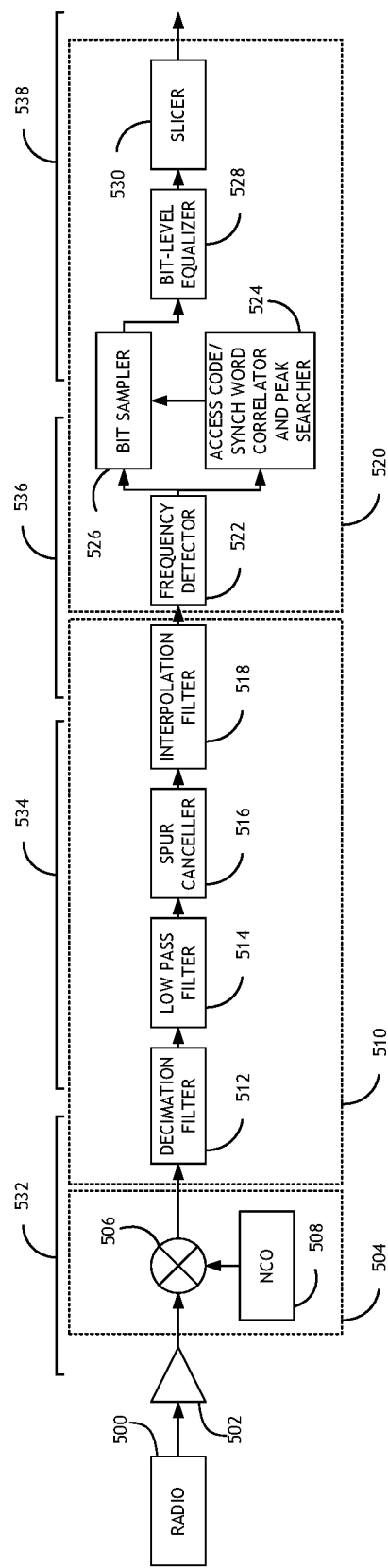
FIG. 5 is a diagram of a circuit to control mode switches in accordance with an embodiment of the present disclosure.

FIG. 5 is a diagram of a circuit to control mode switches in accordance with an embodiment of the present disclosure. A radio 500 operating in an analog domain receives a signal which is converted to a digital signal via an analog-to-digital converter 502. A digital mixer 504 comprising a mixer 506 that receives the digitally sampled signal from the analog-to-digital converter 502 and a signal from a numerically controlled oscillator (NCO) 508. The mixed output is transferred to a digital front end demodulator 510 configured to convert the sampling rate, filter interference, and mitigate DC impairment. The digital front end demodulator 510 comprises a decimation filter 512. In some embodiments, the decimation filter 512 may bit shift the incoming signal to convert the signal from a higher speed clock domain 532 to a lower speed clock domain 534 and transfer it to a low pass filter 514. DC artifacts are removed from the low pass filtered signal via a spur canceller/DC remover 516. An interpolation filter 518 then adjusts the signal, for example via bit shifting, to convert the signal from a lower speed clock domain 534 to a higher speed clock domain 536.

The signal is then passed to a FSK demodulator 520, for an example a Gaussian frequency shift keying (GFSK) demodulator. The FSK demodulator 520 comprises a frequency detector 522 converts the in-phase and quadrature components of the signal to frequency, and remove frequency offsets. The frequency signal is sent to a correlator 524 to identify and correlate symbols based on frequency peaks. The identified symbols and raw frequency are sent to a bit sampler 526 that converts the signal to a lower frequency domain 538 suitable for a processing by a bit equalizer 528 and slicer 530 that outputs a demodulated bit stream.

It is believed that the systems and devices disclosed herein and many of their attendant advantages will be understood by the foregoing description, and it will be apparent that various changes may be made in the form, construction, and arrangement of the components thereof without departing from the broad scope of the present disclosure or without sacrificing all of their material advantages. The form herein before described being merely an explanatory embodiment thereof, it is the intention of the following claims to encompass and include such changes.

The above description is intended to be illustrative, and not restrictive. For example, the above-described embodiments (or one or more aspects thereof) may be used in combination with each other. Other embodiments will be apparent to those of skill in the art upon reviewing the above description. In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. In the event of inconsistent usages between this document and those documents so incorporated by reference, the usage in the incorporated reference(s) should be considered supplementary to that of this document; for irreconcilable inconsistencies, the usage in this document supersedes the usage in any incorporated references.

Although the claimed subject matter has been described with reference to specific embodiments, it will be evident that various modifications and changes may be made to these embodiments without departing from the broader spirit and scope of what is claimed. Accordingly, the specification and drawings are to be regarded in an illustrative rather than a restrictive sense. The scope of the claims should be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended; a system, device, article, or process that includes elements in addition to those listed after such a term in a claim are still deemed to fall within the scope of that claim. Moreover, in the following claims, the terms "first," "second," and "third," etc. are used merely as labels and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims.

What is claimed is:

1. A demodulator, comprising:
   a receiver; and
   a direct current removing (DCR) circuit, the DCR circuit transitions between:
      an acquisition mode, wherein the DCR circuit operates with a loop gain block having a first loop gain and first accumulation value to identify a plurality of harmonic spurs resulting from a 16 MHz clock frequency oscillator, including a spur at 2480 MHz coinciding with a center frequency of a Bluetooth low energy radio; and
      a tracking mode, wherein the DCR circuit operates with the loop gain block having a second loop gain and second accumulation value,
   wherein:
      the second loop gain is smaller than the first loop gain;
      each of the first loop gain and second loop gain is constrained to a power of 2 and implemented as bit shifts in a system of registers;
      the second accumulation value is defined by the first accumulation value multiplied by the first loop gain, divided by the second loop gain;
      a timing of the transition between the acquisition mode and tracking mode is programmable; and
      the DCR circuit re-identifies the spurs whenever the receiver is cycled from an off power state to an on power state.

2. The demodulator of claim 1, wherein the DCR circuit transitions to a holding mode to freeze a loop gain of the DCR circuit for data demodulation.

3. The demodulator of claim 2, wherein the transition to the holding mode occurs upon completion of synchronization.

4. The demodulator of claim 1, wherein the transition between the acquisition mode and the tracking mode is controlled by a hardware finite state machine.

5. The demodulator of claim 4, wherein a spur estimate acquired in the acquisition mode is used as an initial value for the tracking mode.

6. The demodulator of claim 5, wherein an accumulation value maintained by the DCR circuit operating in the acquisition mode is scaled when the DCR circuit transitions from the acquisition mode to the tracking mode.

7. The demodulator of claim 1, wherein the demodulator is a frequency-shift keying (FSK) demodulator.

8. The demodulator of claim 1, wherein the DCR circuit forms at least a part of a digital front end of the demodulator.

9. A demodulator, comprising:
   a receiver; and
   a direct current removing (DCR) circuit comprising a system of registers configured to bit shift a signal according to one of a plurality of loop gain values, the DCR circuit transitions among:
      an acquisition mode, wherein the DCR circuit operates with a loop gain block having a first loop gain and first accumulation value to identify a plurality of harmonic spurs resulting from a 16 MHz clock frequency oscillator, including a spur at 2480 MHz coinciding with a center frequency of a Bluetooth low energy radio;
      a tracking mode, wherein the DCR circuit operates with the loop gain block having a second loop gain and second accumulation value; and a holding mode, wherein the DCR circuit freezes a loop gain of the DCR circuit for data demodulation, wherein:

the second loop gain is smaller than the first loop gain;

the second accumulation value is defined by the first accumulation value multiplied by the first loop gain, divided by the second loop gain;

each of the first loop gain and second loop gain is constrained to a power of 2;

a timing of the transition between the acquisition mode and tracking mode is programmable;

the transition to the holding mode occurs upon completion of synchronization; and the DCR circuit re-identifies the spurs, beginning with the frozen loop gain, whenever the receiver is cycled from an off power state to an on power state.

10. The demodulator of claim 9, wherein the transition among the acquisition mode, the tracking mode, and the holding mode is controlled by a hardware finite state machine.

11. The demodulator of claim 9, wherein a spur estimate acquired in the acquisition mode is used as an initial value for the tracking mode.

12. The demodulator of claim 11, wherein an accumulation value maintained by the DCR circuit operating in the acquisition mode is scaled when the DCR circuit transitions from the acquisition mode to the tracking mode.

13. The demodulator of claim 9, wherein the demodulator is a frequency-shift keying (FSK) demodulator.

14. The demodulator of claim 9, wherein the DCR circuit forms at least a part of a digital front end of the demodulator.

15. A method for demodulating a signal, comprising:

placing a direct current removing (DCR) circuit into an acquisition mode having a first loop gain and a loop gain block maintains a first accumulation value;

setting an acquisition mode timer of no more than 4 microseconds;

identifying a spur in a plurality of harmonic spurs resulting from a 16 MHz clock frequency oscillator, the spur at 2480 MHz coinciding with a center frequency of a Bluetooth low energy radio;

converting a signal from a first clock domain defined by the clock frequency, to a second clock domain having a lower clock speed than the first clock domain via bit shift by a decimation filter;

placing the DCR circuit into a tracking mode having a second loop gain and the loop gain block maintains a second accumulation value based on at least one of the acquisition mode timer expiring or identifying the spur; and re-identifying the spurs whenever a receiver is cycled from an off power state to an on power state, wherein:

the second loop gain is smaller than the first loop gain;

the second accumulation value is defined by the first accumulation value multiplied by the first loop gain, divided by the second loop gain.

16. The method of claim 15, further comprising placing the DCR circuit into a holding mode to freeze a loop gain of the DCR circuit for data demodulation.

17. The method of claim 16, further comprising transitioning from the holding mode to one of the tracking mode or acquisition mode when a packet error ratio exceeds a threshold.

18. The method of claim 15, wherein identifying when to place the DCR circuit into the tracking mode is controlled by a hardware finite state machine.

19. The method of claim 15, further comprising acquiring a spur estimate in the acquisition mode as an initial value for the tracking mode.

20. The method of claim 19, further comprising scaling an accumulation value identified in the acquisition mode prior to placing the DCR circuit into the tracking mode.

* * * * *